(12) United States Patent
Yadav et al.

(10) Patent No.: US 11,586,796 B1
(45) Date of Patent: Feb. 21, 2023

(54) KEEP-THROUGH REGIONS FOR HANDLING END-OF-LINE RULES IN ROUTING

(71) Applicant: Synopsys, Inc., Mountain View, CA (US)

(72) Inventors: Praveen Yadav, Bangalore (IN); Ramprasath Srinivasa Gopalakrishnan, Minneapolis, MN (US)

(73) Assignee: Synopsys, Inc., Mountain View, CA (US)

( * ) Notice: Subject to any disclaimer, the term of this patent is extended or adjusted under 35 U.S.C. 154(b) by 0 days.

(21) Appl. No.: 17/215,448

(22) Filed: Mar. 29, 2021

Related U.S. Application Data

(60) Provisional application No. 63/000,883, filed on Mar. 27, 2020.

(51) Int. Cl.
*G06F 30/392* (2020.01)
*G06F 30/398* (2020.01)
*G06F 30/394* (2020.01)

(52) U.S. Cl.
CPC .......... *G06F 30/392* (2020.01); *G06F 30/394* (2020.01); *G06F 30/398* (2020.01)

(58) Field of Classification Search
CPC ...... G06F 30/394; G06F 30/392; G06F 30/39; G06F 30/398; G06F 16/2379; G06F 30/30; G06F 2111/04; G06F 2119/18; G06F 16/43; G06F 16/953; G06F 2111/12; G06F 30/327; G06F 21/31; G06F 21/60; G06F 21/78; G06F 2119/02; G06F 2119/12; G06F 30/367; G06F 30/3947; G06F 30/3953; G06F 30/396; G06F 16/24; G06F 16/245; G06F 17/18; G06F 16/3344; G06F 2115/02; G06F 2203/012; G06F 2203/04806; G06F 2203/04808; G06F 3/011; G06F 3/013; G06F 3/017; G06F 3/0304; G06F 3/04845; G06F 3/04847; G06F 3/04883; H01L 27/0688; H01L 27/0207; H01L 23/49838; H01L 27/0248; H01L 2225/06544; H01L 2224/24146; H01L 23/522; H01L 27/1104; H01L 23/544; H01L 21/31144; H01L 21/823481; H01L 23/5283; H01L 2225/06541
USPC .................................................. 716/116–123
See application file for complete search history.

(56) References Cited

U.S. PATENT DOCUMENTS

| | | | |
|---|---|---|---|
| 10,192,021 B1 * | 1/2019 | Raj ...................... | G06F 30/398 |
| 2014/0115546 A1 * | 4/2014 | Wang .................... | G06F 30/398 716/55 |
| 2020/0135637 A1 * | 4/2020 | Peng ................. | H01L 21/76877 |

* cited by examiner

*Primary Examiner* — Binh C Tat
(74) *Attorney, Agent, or Firm* — Fenwick & West LLP

(57) ABSTRACT

A routing process applied to design integrated circuits uses keep-through regions. Keep-through regions specify areas which metal shapes may overlap but where metal shapes may not have line ends. The keep-through regions are generated based on end-of-line rules applicable to routing of the design. These keep-through regions are then used in determining the layout of interconnects for the design. The interconnects are composed of metal shapes, and the line ends of the metal shapes are located in accordance with the keep-through regions

17 Claims, 11 Drawing Sheets

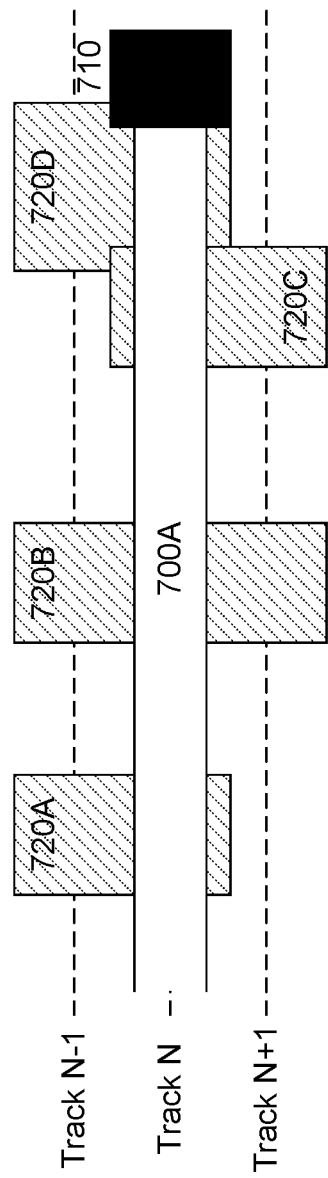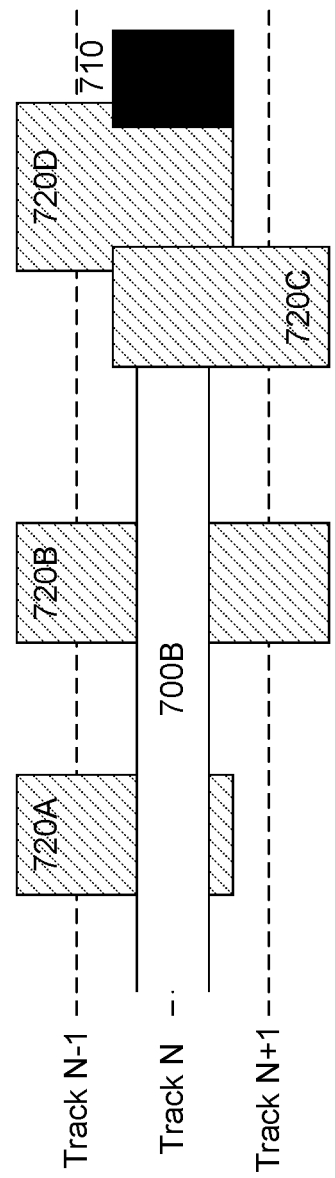

KEEP-THROUGH REGIONS FOR HANDLING END-OF-LINE RULES IN ROUTING

RELATED APPLICATION

This application claims priority under 35 U.S.C. § 119(e) to U.S. Provisional Patent Application Ser. No. 63/000,883, "Method for Inserting Cut-Metal Shapes and Handling End-Of-Line Rules in Shape Based Routers," filed Mar. 27, 2020. The subject matter of all of the foregoing is incorporated herein by reference in its entirety.

TECHNICAL FIELD

The present disclosure relates to routing in integrated circuits and, more specifically, to the use of keep-through regions to handle end-of-line rules during routing.

BACKGROUND

Place and route are important processes in the design flow for integrated circuits. In the placement process, the placement of components of the integrated circuit at physical locations on the semiconductor die is determined. In the routing process, the physical layout of the interconnects used to connect the different components is determined. These can be very complex processes, particularly given the increasing complexity and number of components on integrated circuits. Accordingly, software tools are used to automate these processes.

Generally speaking, the goal in routing is to lay out all of the required physical interconnects as densely as possible with the shortest lengths possible, and to complete this task in the least amount of design time and with the most automation. However, certain requirements must be followed in order to ensure acceptable performance, manufacturability, yield, reliability, etc. For example, interconnects cannot be too thin, or too close to each other, or create too much capacitance or resistance. These requirements are generally referred to as design rules. The design rules themselves can be complex and new design rules may be added as new semiconductor fabrication processes are developed to manufacture integrated circuits of increasing complexity and density.

SUMMARY

In certain aspects, a routing process applied to design integrated circuits uses keep-through regions to handle end-of-line design rules. Keep-through regions specify areas which metal shapes may overlap but where metal shapes may not have line ends. The keep-through regions are generated based on end-of-line rules applicable to the routing of the design. These keep-through regions are then used in determining the layout of interconnects for the design. The interconnects are composed of metal shapes, and the line ends of the metal shapes are located in compliance with the keep-through regions.

Other aspects include components, devices, systems, improvements, methods, processes, applications, computer readable mediums, and other technologies related to any of the above.

BRIEF DESCRIPTION OF THE DRAWINGS

The disclosure will be understood more fully from the detailed description given below and from the accompanying figures of embodiments of the disclosure. The figures are used to provide knowledge and understanding of embodiments of the disclosure and do not limit the scope of the disclosure to these specific embodiments. Furthermore, the figures are not necessarily drawn to scale.

FIGS. 7A and 7B illustrate determination of a maximal metal shape.

DETAILED DESCRIPTION

Figure 1A:
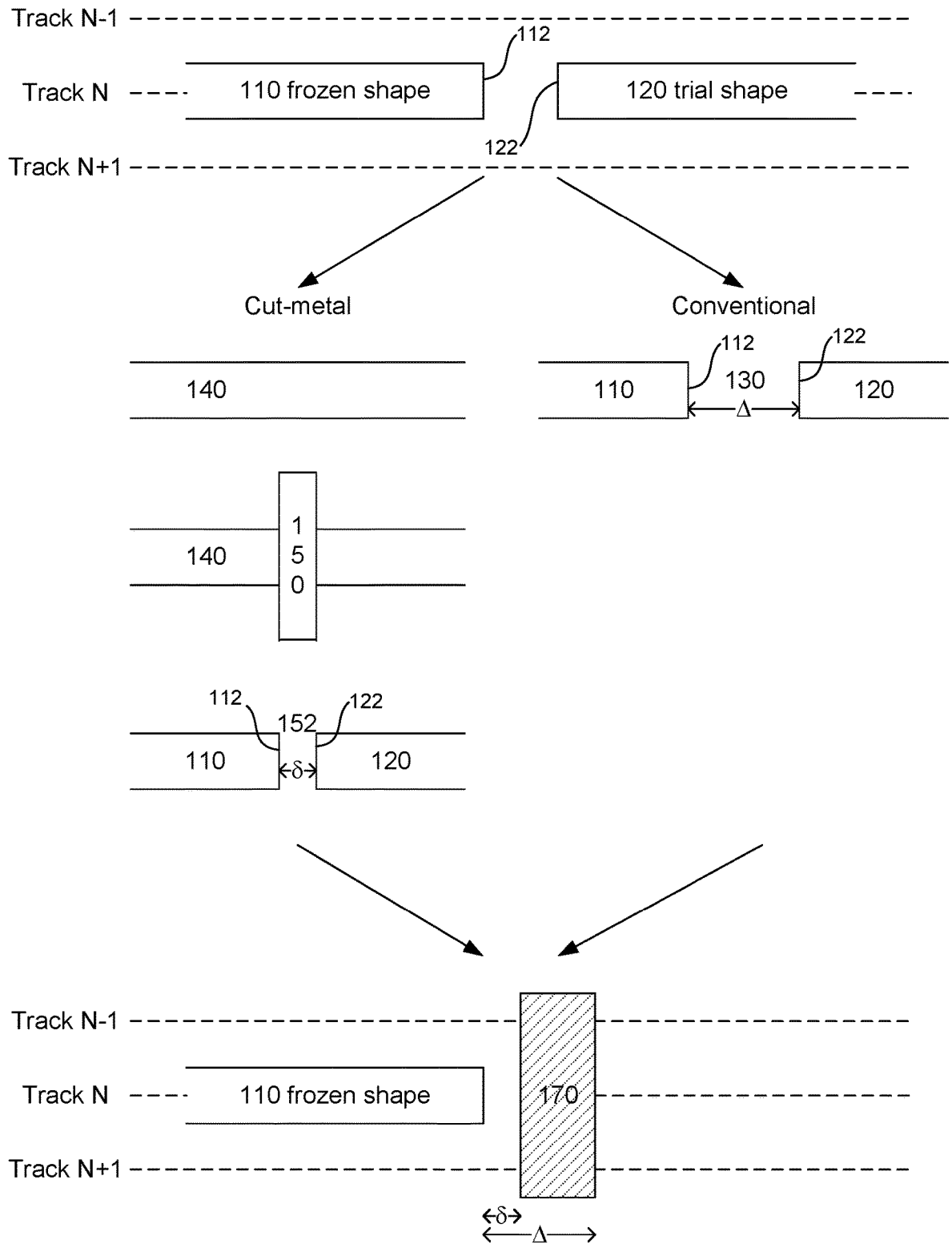
FIG. 1A depicts an example of end-of-line rules that generate keep-through regions for cut-metal shapes.

Aspects of the present disclosure relate to keep-through regions for handling end-of-line rules in routing. The following description uses metal layers, but other non-metal layers may also be used, such as poly layers. In most integrated circuits, the interconnects used to connect different elements of the integrated circuit are laid out using different metal layers. Any particular route from one point to another is composed of metal shapes on different layers, with vias connecting the metal shapes on different layers. The metal shapes on each layer are typically laid out in predefined tracks or lanes, where the tracks on adjacent layers are oriented orthogonally to each other. For example, using compass directions, the tracks on odd number metal layers may run predominantly along the east-west direction, while the tracks on even number metal layers may run predominantly along the north-south direction. On any layer, metal shapes from different routes may be adjacent to each other, and denser packing of these routes is generally preferred.

However, particularly at more advanced process technology nodes, such as 20 nm and smaller, there can be complex rules that govern the layout of these shapes. One subset of design rules concerns the locations of the ends of the metal shapes. For example, the neighboring ends of two adjacent metal shapes (line ends) may not be too close or it will be too difficult to fabricate the metal shapes without defects. The requirements and limitations on the placement of these line ends are generally referred to as end-of-line rules, regardless of whether they are stated expressly in design rules or implied or derived from other design rules. In certain cases, end-of-line rules may allow metal shapes to pass through an area so long as the metal shape does not end inside that area.

One example is cut-metal insertion. Cut-metal insertion is a technique used at advanced technology process nodes to help achieve higher routing density, which directly translates to more logic in a smaller area. However, cut-metal insertion comes with its own set of rules. Current routers have a post-routing fill step, where they extend metal shapes or insert dummy metals to handle the cut-metal rules. These methods do not guarantee availability of enough resources for cut-metal insertion or to handle all the design rules related to the cut-metals. For example, a post-routing shape extension may not reserve enough space to guarantee extensions. This leads to solutions that are not clean in terms of end-of-line rules. This leads to loss in compaction, which trickles down to loss in performance/area. Ignoring metal shape extensions during routing also leads to an incorrect estimation of routing costs.

In one aspect, end-of-line rules, including for cut-metal insertion, are handled using keep-through regions during routing exploration, rather than as a post-routing step. A keep-out region is an area where metal shapes are not allowed. A keep-through region is an area where metal shapes are allowed, but they are not allowed to end within the keep-through region. That is, the line end for the metal shape may be located to one side or to the other side of the keep-through region, but it may not fall within the keep-through region.

The routing process then proceeds as follows. A design of an integrated circuit is accessed. This design typically has been placed already and is now ready for routing. The software router tool will automatically generate layouts of interconnects for the design, as follows. Keep-through regions are generated based on the end-of-line rules applicable to the routing of the design. The keep-through regions specify areas which metal shapes may overlap but where metal shapes may not have line ends. These are included as part of the search space used by the router to explore possible routing. The layout of interconnects for the design within the router search space is then determined. The interconnects comprise metal shapes that have line ends in accordance with the keep-through regions.

This approach may have any of the following advantages. The expression of end-of-line rules as keep-through regions provides a systematic approach that streamlines the routing process. Routers already handle keep-out regions. Extending these capabilities to also handle keep-through regions may take advantage of the infrastructure already in place for keep-out regions. In addition, the use of keep-through regions allows these end-of-line designs rules to be considered during the routing exploration phase, rather than as an ad hoc post-routing fix. This will improve corresponding digital (i.e., IC Compiler II) and analog (i.e., Custom Compiler) design platforms.

FIG. 1A depicts an example of end-of-line rules that generate keep-through regions. This example is based on cut-metal insertion, which is a technique used at advanced process technology nodes to reduce the required spacing between adjacent line ends. In FIG. 1A, metal shape 110 on track N is part of a previously completed route. These are sometimes referred to as frozen shapes. The router is now exploring another route and part of the search space includes possible metal shape 120 on track N to the east of frozen shape 110. The two metal shapes 110, 120 have line ends 112, 122 that are facing each other. In a conventional fabrication approach, shown in the right-hand column of FIG. 1A, the two adjacent metal shapes 110, 120 may be created using a mask that defines metal shape 110, a gap 130, and then the other metal shape 120. However, the gap 130 between the two lines ends 112, 122 must be at least a certain minimum width $\Delta$ for reliable fabrication.

An alternative is the cut-metal approach, as shown in the left-hand column of FIG. 1A. In this approach, the two adjacent metal shapes are first created as a single continuous shape 140. This continuous shape 140 is then cut using an inverse mask 150. This is sometimes referred to as the cut-metal shape 150. This process produces the two metal shapes 110, 120 separated by the width of the resulting cut 152. The cut width can be smaller than the minimum gap size $\Delta$ in the conventional approach, thus reducing the spacing between the two line ends 112, 122.

Figure 1B:
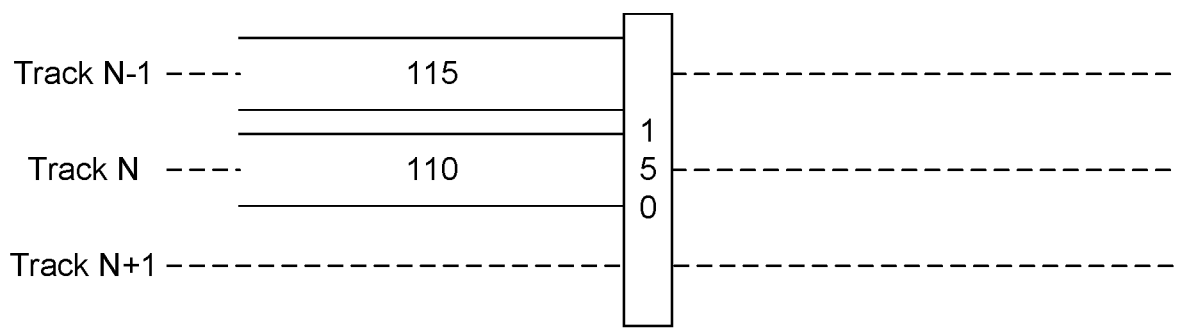
FIGS. 1B-1D show different configurations for cut-metal shapes.
Figure 1C:
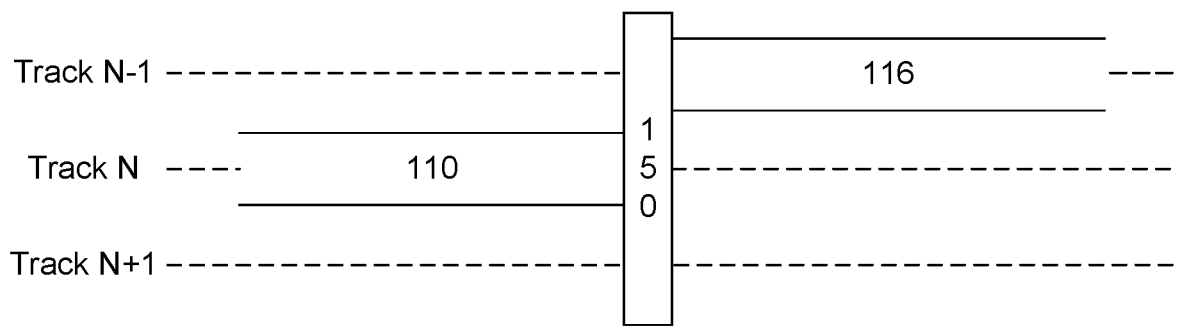
Figure 1D:
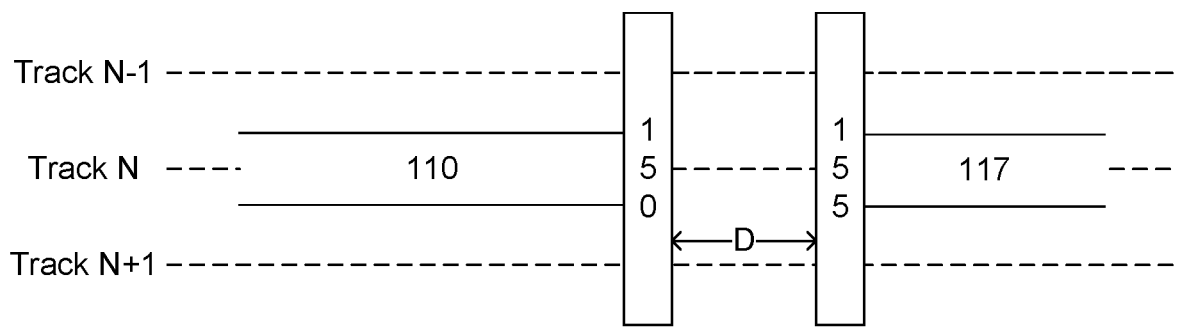

However, there may also be restrictions on the locations and shapes of the cuts. The width of the cut-metal shape has some minimum $\delta$ and narrower cuts are not reliably manufacturable. Wider cuts may be possible, but they will result in less compaction. Therefore, a cut-metal design rule may specify that widths of cut-metal shapes are set to the smallest achievable width $\delta$. In addition, cuts may be more reliably manufactured and more compaction may be achieved if cuts span multiple tracks, as shown in FIGS. 1B and 1C. In FIG. 1B, metal shapes 110 and 115 have aligned line ends, which can be created by a single cut from the cut-metal shape 150 that spans multiple tracks. The same is true in FIG. 1C, except that the metal shapes 110 and 116 lie on opposite sides of the cut-metal shape 150. In these cases, line ends on adjacent tracks will align to each other, which is preferred for more compaction. There is also a minimum required spacing between cuts. Two cuts cannot be too close to each other, or they will not be reliably manufacturable. In FIG. 1D, metal shape 117 may be formed by cut-metal shape 155, but cut-metal shape 155 must be some minimum spacing D away from cut-metal shape 150. Generally, more compaction may be achieved if the cut-metal shapes are kept to their minimum widths and minimum spacings. All of these considerations may contribute to end-of-line rules and corresponding keep-through regions. Note that some of these requirements and the corresponding rules and keep-through regions may be soft requirements. For example, it may be desirable for cuts to span many tracks but it may not be absolutely required.

The fabrication options described above yield requirements (both hard and soft requirements) on the location of the line end 122 relative to line end 112. In this example, the end-of-line rules are that the separation of the line ends 112, 122 may be equal to $\delta$ or it may be greater than $\Delta$, but it may not be between $\delta$ and $\Delta$. Note that these rules may be stated expressly, for example by the foundry, or they may be implicit in or derived from other design rules. As shown in the bottom of FIG. 1A, keep-through region 170 for track N may be generated from the application of these end-of-line rules to frozen line end 112. Keep-through region 170 spans the separations from $\delta$ to $\Delta$. The keep-through region allows line end 122 to be located at a separation equal to $\delta$ or at separations greater than $\Delta$, but line end 122 may not be located between $\delta$ and $\Delta$. In this example, the keep-through region 170 also extends to adjacent tracks N−1 and N+1, in order to either enforce or encourage alignment of line ends across multiple tracks, so that the corresponding cut may span multiple tracks.

Figure 2A:
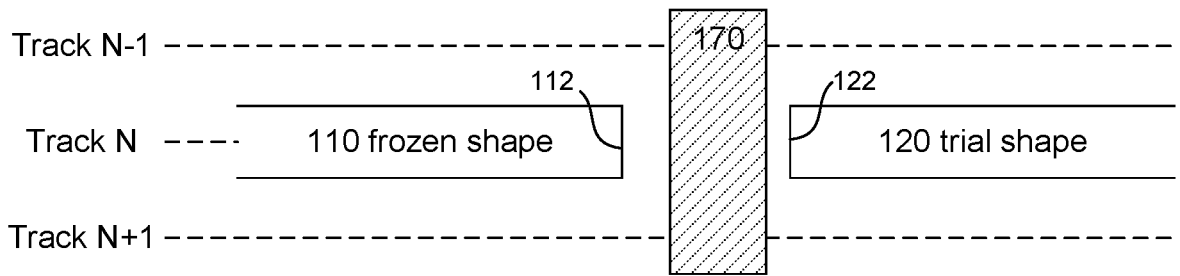
FIGS. 2A-2D show different line end separations between metal shapes on the same track.
Figure 2B:
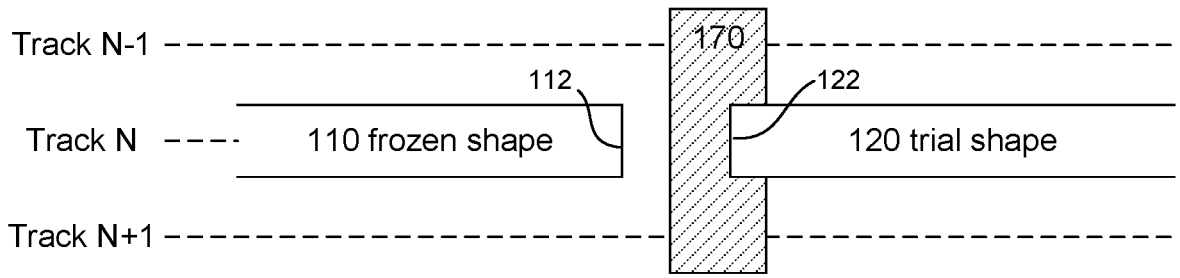
Figure 2C:
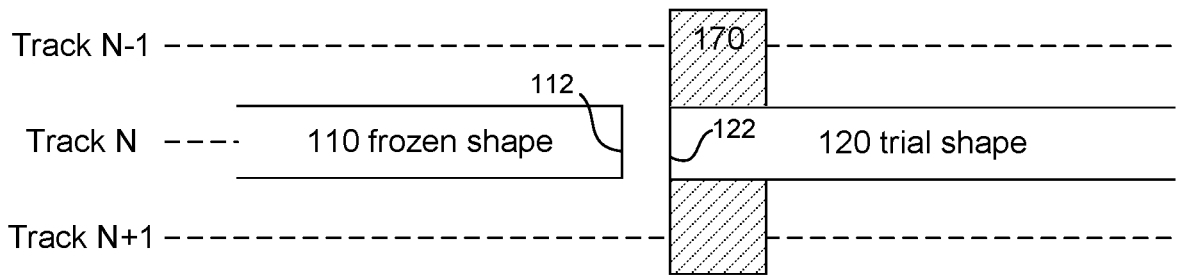
Figure 2D:
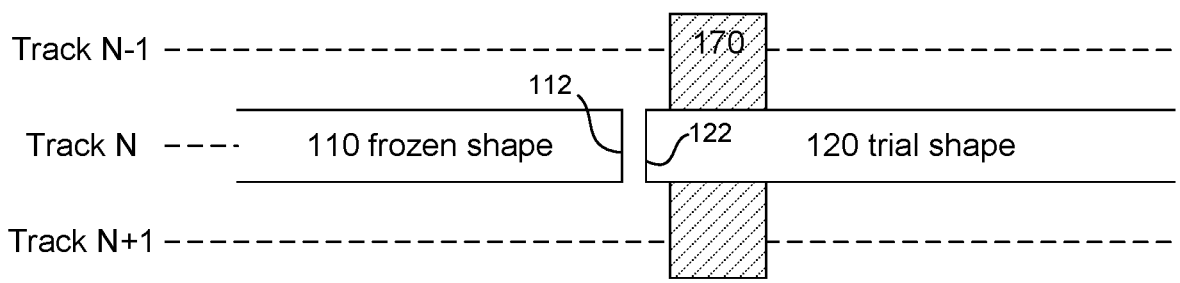

FIGS. 2A-2D show the operation of keep-through region 170, considering different separations of line ends 112, 122, in order of decreasing separation. In FIG. 2A, the line end 122 is located with a separation of $\Delta$ or greater relative to frozen line end 112. This is allowed by the keep-through region 170, because a conventional mask-based approach may be used to fabricate this configuration. In FIG. 2B, the line end 122 is located with a separation between δ and Δ. Neither approach can fabricate this size separation, so it is not allowed by the keep-through region 170. In FIG. 2C, the line end 122 is located with separation δ relative to frozen line end 112. This is allowed by the keep-through region 170, because the cut-metal approach may be used. In FIG. 2D, the line end 122 is located with separation less than δ. Strictly speaking, this would be allowed by keep-through region 170, but in the design flow it would be prohibited by a separate keep-out region (not shown) because the two line ends 112, 122 are too close.

Figure 3A:
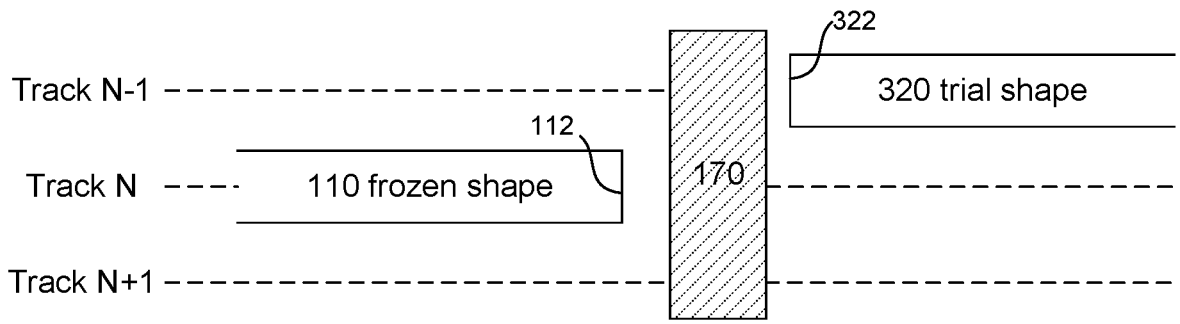
FIGS. 3A-3D show different line end separations between metal shapes on adjacent tracks with opposing orientations.
Figure 3B:
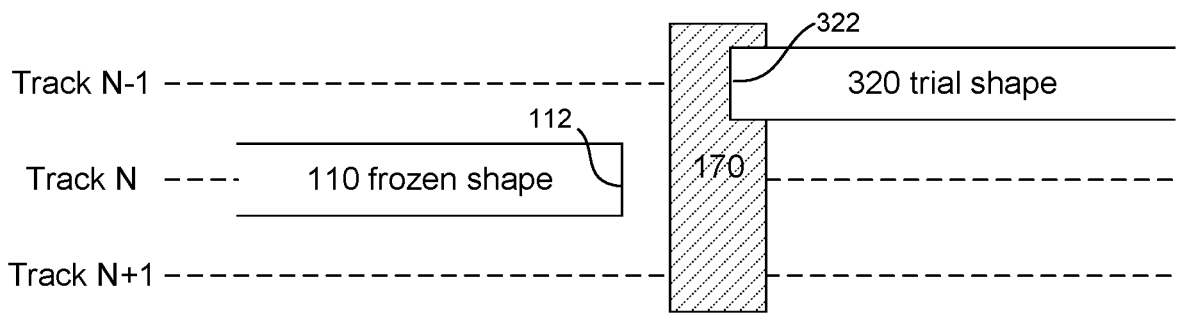
Figure 3C:
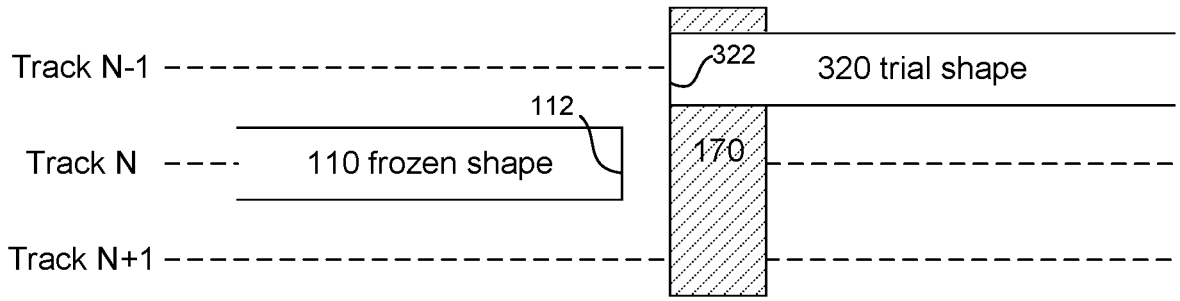
Figure 3D:
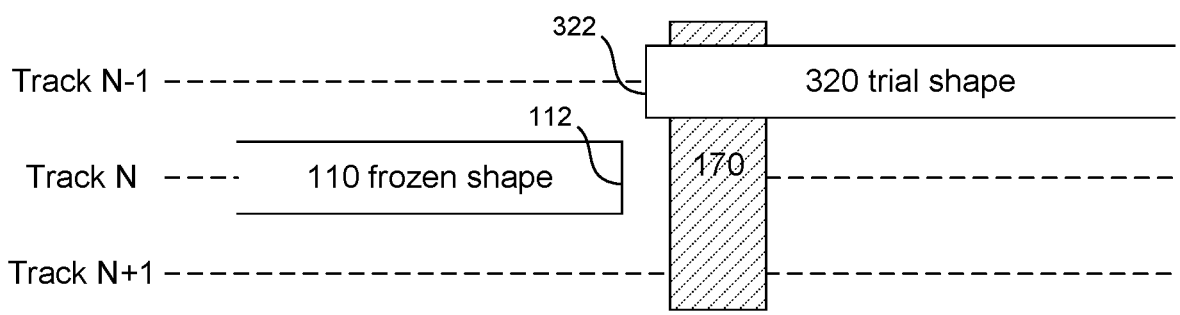

In this example, keep-through region 170 also applies to adjacent tracks N−1 and N+1. FIGS. 3A-3D show one approach for geometries with frozen metal shape 110 on track N and trial metal shape 320 on adjacent track N−1, as the trial shape 320 approaches from the east. FIGS. 3A-3C are analogous to FIGS. 2A-2C. In FIG. 3A, the line end 322 is located with a separation of Δ or greater relative to frozen line end 112. This is allowed by keep-through region 170. In FIG. 3B, the line end 322 is located with a separation between δ and Δ. This is not allowed by the keep-through region 170, in an effort to align cuts on adjacent tracks. In FIG. 3C, the line end 322 is located with separation δ relative to frozen line end 112. This is allowed, because the cut-metal approach may also be used with adjacent tracks. In FIG. 3D, the line end 322 is located to the west of the position in FIG. 3C. This is also allowed by keep-through region 170, but may be prohibited by other requirements.

Figure 4A:
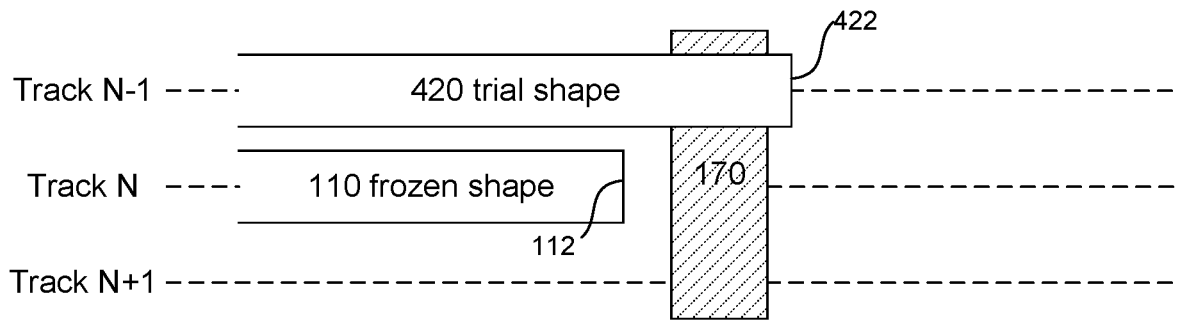
FIGS. 4A-4D show different line end separations between metal shapes on adjacent tracks with the same orientation.
Figure 4B:
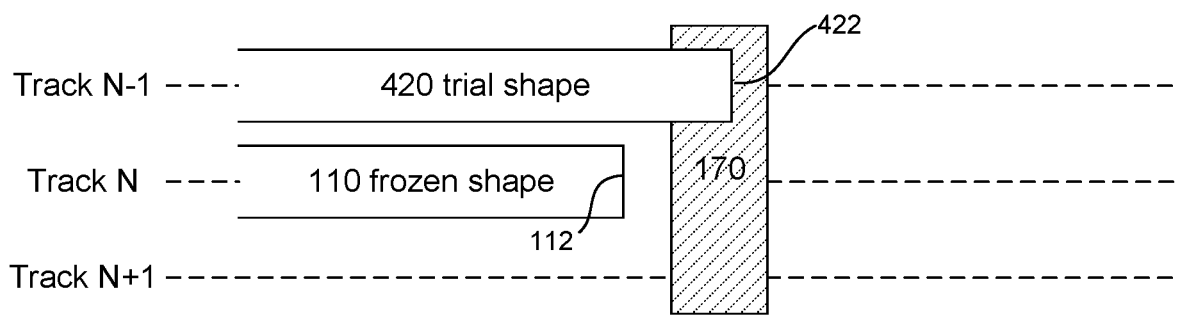
Figure 4C:
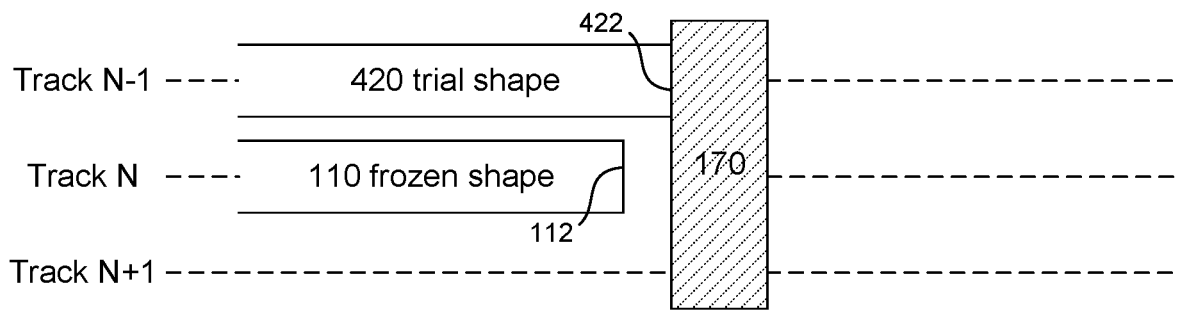
Figure 4D:
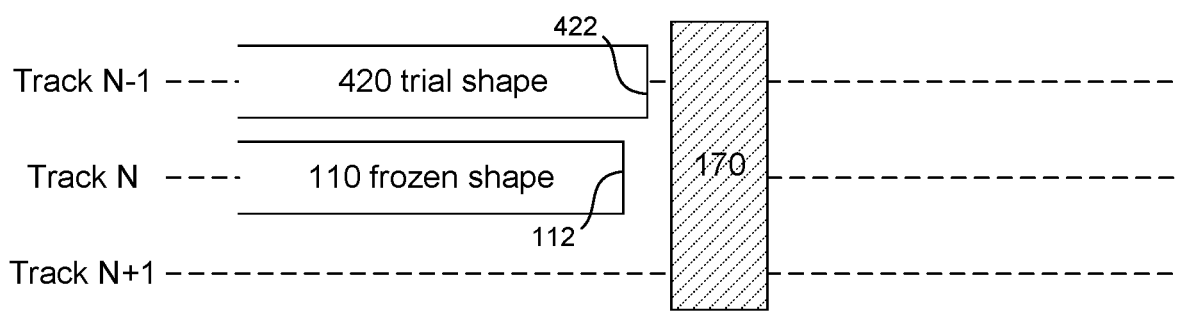

FIGS. 4A-4D show geometries analogous to those shown in FIGS. 3A-3D, except that the trial shape 420 on adjacent track N−1 approaches from the west. In this example, because the line ends 112, 422 have the same east-facing orientation, the keep-through region 170 does not apply any restrictions on the location of line end 422. The line end positions shown in FIGS. 4A, 4C and 4D are all allowed by the keep-through region 170, as was the case in FIGS. 3A, 3C and 3D. However, the line end position shown in FIG. 4B, where the separation is between δ and Δ is also allowed by the keep-through region 170 in this embodiment. This is not always the case, but it can be the case. In this case, the keep-through region 170 is directional. Metal shapes entering the keep-through region from one side may not have line ends in the keep-through region as in FIG. 3B, but metal shapes entering the keep-through region from the opposite side may have line ends in the keep-through region as in FIG. 4B. Put in another way, line ends oriented in the same direction are not affected by the keep-through region (e.g. both east-facing lines ends 112, 422 in FIG. 4B) whereas line ends oriented in opposite directions are subject to the keep-through region (e.g., west-facing line end 322 versus east-facing line end 112 in FIG. 3B).

Figure 5:
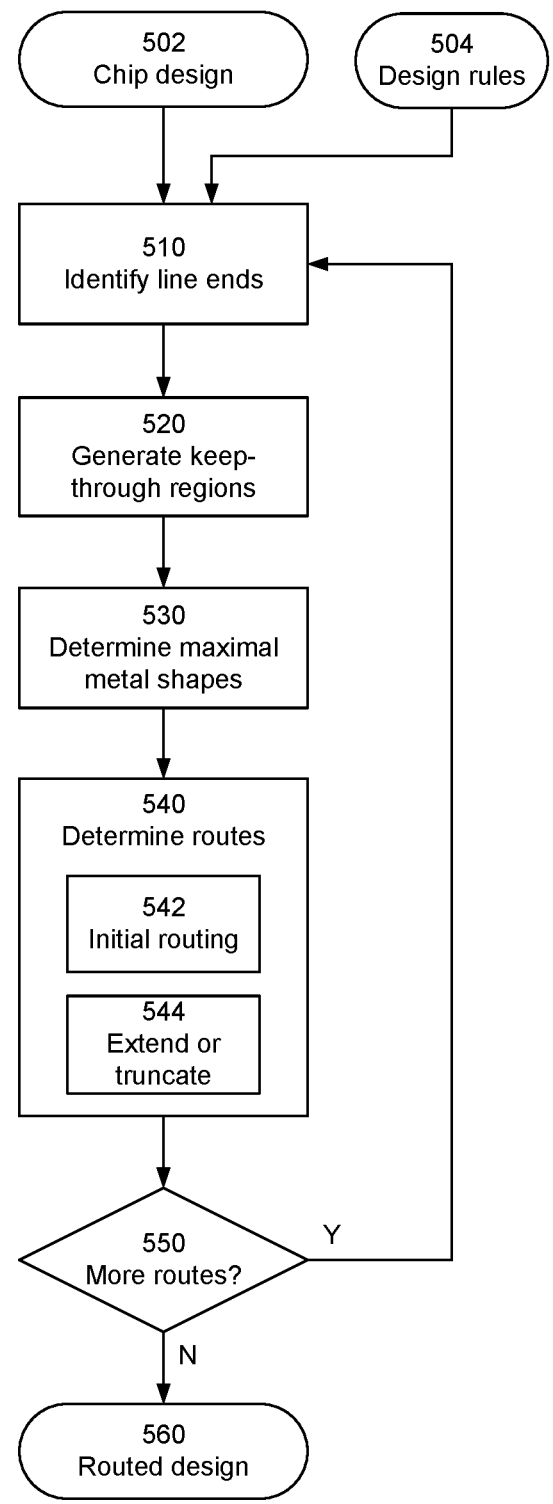
FIG. 5 is a flow diagram of routing using keep-through regions.

FIG. 5 is a flow diagram of a routing process using keep-through regions, such as those described above. Routing is typically performed progressively, meaning that not all routes are determined concurrently. Rather, the router explores a search space for a set of one or more routes, determines routes within that search space, and then goes on to a next set of routes. The loop 550 of FIG. 5 represents this progressive processing of routes. During any iteration, there will be some already completed routes (frozen routes), the routes currently under consideration (trial routes or candidate routes), and other routes still to be routed. The routes currently under consideration may be partially routed, with trial metal shapes that the router is attempting to assemble into a completed route.

The routing process shown in FIG. 5 includes the following. The inputs to the process are the design 502 of the integrated circuit and design rules 504 applicable to the design. The design typically includes already placed components and the logical connections between those components. Design rules specify requirements and limitations on the routing process, such as the spacing requirements for cut-metal shapes as described above. The routing process then determines the physical layout of the interconnects specified in the design, subject to the design rules.

The process shown in FIG. 5 emphasizes the steps that relate to keep-through regions. It should be understood that additional or different steps may also be included as part of the routing process, for example steps that relate to keep-out regions. In FIG. 5, the router identifies 510 line ends on already completed routes and possibly also for trial metal shapes on the current routes under consideration. It then generates 520 keep-through regions based on end-of-line rules applicable to these line ends. Keep-through regions specify areas which metal shapes may overlap but where metal shapes may not have line ends. The router may also generate other constraints, such as keep-out regions. These are part of the search space explored by the router to determine routing. In one approach, the router determines 530 the maximum available metal spaces for routing, taking into account constraints such as keep-through regions and keep-out regions. This is sometimes referred to as maximal metal shapes or maximal metal lengths. The layout of the routes is then determined 540, limited to the maximum available metal spaces and in accordance with the keep-through regions.

In one approach, the router first determines 542 an initial routing without considering keep-through regions. If line ends fall in keep-through regions, these metal shapes are then extended or truncated 544 in order to comply with the requirements of the keep-through regions.

Line extensions produce extra metal, and this may be taken into account when assessing the cost of different candidate routes. For example, shape-based routers typically perform a costed routing approach, where the cost of a route is a function of the length of the route. Different layers are costed differently, depending on the layer parasitic constraints and congestion. In such shape-based routers, keep-through regions generated from the neighboring metal shapes can be used to determine when line extensions may be necessary for candidate routes and then costed appropriately during routing, rather than in a post-routing step.

The looping 550 may be performed in different ways. For example, in one approach, steps 510-530 are performed only in a local vicinity for the current routes under consideration. Thus, line ends are identified 510 only for metal shapes in the vicinity of the possible routes, and the same is true for the generation 520 of keep-through regions and the determination 530 of maximal metal lengths. In an alternate approach, steps 510-530 may be performed more globally and then updated as more routes are completed. Combinations of the two approaches may also be used.

Figure 6:
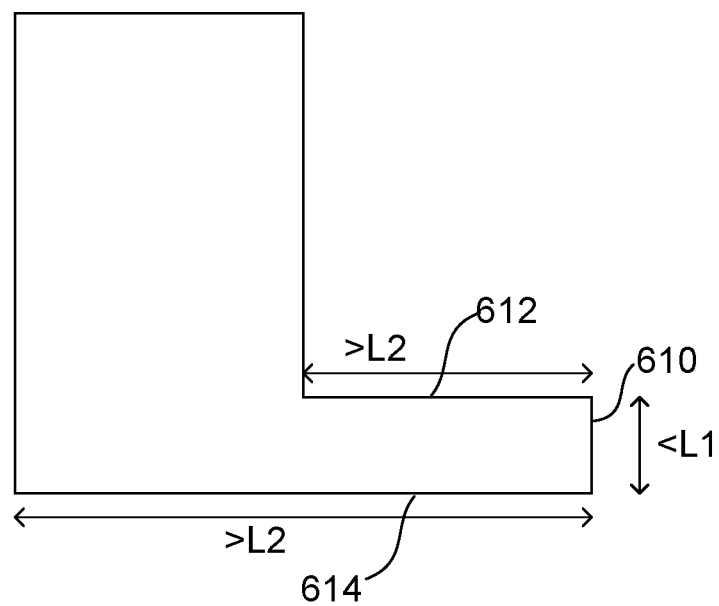
FIG. 6 is a diagram of a polygonal metal shape that illustrates the properties used to define a line end.

FIG. 6 is a diagram of a polygonal metal shape that illustrates the properties used to define a line end. This is one example of step 510 in FIG. 5. In this example, an edge of a polygonal metal shape is a line end if it satisfies the following properties: (1) both of the corners of the edge are convex, (2) the edge length is less than a specified threshold value ($L_1$ in FIGS. 6), and (3) both adjacent edges have a length greater than a second specified threshold value ($L_2$ in FIG. 6). FIG. 6 illustrates these properties using edge 610. The corners at the ends of edge 610 are both convex, the edge 610 has a length less than $L_1$, and the adjacent edges 612 and 614 each have a length greater than $L_2$. Thus, the edge 610 qualifies as a line end. The thresholds $L_1$ and $L_2$ may be adjustable or set by the user. Alternatively, they may be set based on the applicable design rules or by automated analysis of the physical layout, for example the statistical distribution of edge lengths.

Other approaches may also be used to identify line ends. When metal shapes are laid out in tracks, line ends may be identified based on the orientation of the edges. For tracks that run east-west, east- and west-facing edges may be assumed to be line edges while north- and south-facing edges are not. These rules may be further refined. For example, if a metal shape crosses orthogonally across multiple east-west tracks, then the north- and south-facing edges of that shape may be identified as line edges.

FIGS. 7A and 7B illustrate determination of a maximal metal shape 700. This is one example of step 530 in FIG. 5. The maximal metal shape is the maximum metal space available for routing. This limits the search space for the router. The layout of routes is then determined within this search space. In the example of FIG. 7, keep-out regions are first considered, and then keep-through regions. In addition, since the layout is based on tracks in this example, the maximal metal shape may be referred to as the maximal metal length of a track. The search space is then defined by the maximal metal lengths of all relevant tracks.

FIGS. 7A and 7B illustrate determination of the east edge of maximal metal length 700. In FIG. 7A, the search space includes keep-out region 710 and keep-through regions 720A-D. Here, keep-out region 710 prevents the metal shape 700A from extending further to the east. Thus, FIG. 7A shows the maximal metal length 700A when accounting for keep-out regions but not keep-through regions.

FIG. 7B shows the effect of keep-through regions. Keep-through regions 720C-D are located adjacent to keep-out region 710, at the end of the maximal metal length shown in FIG. 7A. As a result, the metal shape cannot extend into these regions, because there is no space for the metal shape to extend through the region and exit the other side. Therefore, keep-through regions 720C-D may be treated as keep-out regions and the maximal metal length 700B is further reduced, as shown in FIG. 7B. Keep-through regions 720A-B do not reduce the maximal metal length 700B, because it is possible for the metal shape to extend to the east of these regions while still complying with the keep-through regions. For convenience, overlapping keep-through regions, such as 720C-D, may be merged and treated as a single larger keep-through region.

Figure 8A:
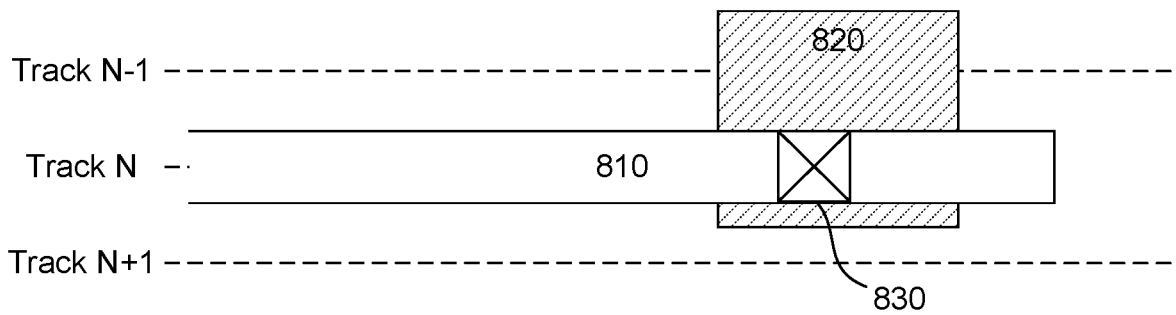
FIGS. 8A-8D illustrate truncating and extending metal shapes to accommodate keep-through regions.
Figure 8B:
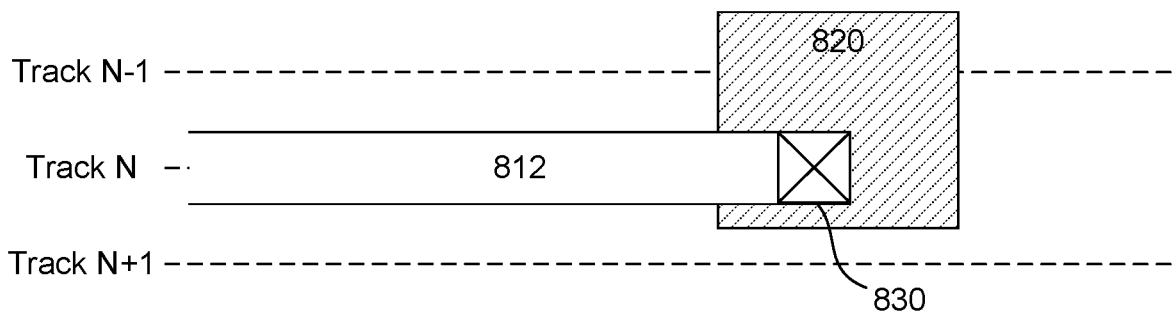
Figure 8C:
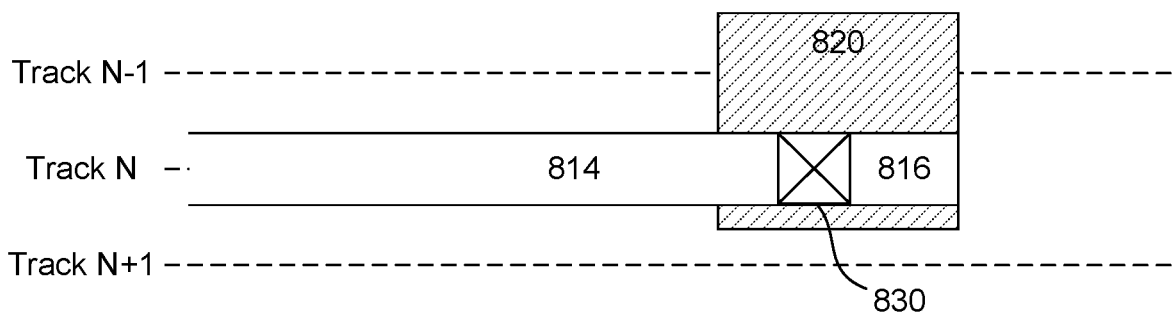

FIGS. 8A-8C illustrate truncating and extending metal shapes to accommodate keep-through regions. FIG. 8A shows a maximal metal shape 810 and a keep-through region 820. The router is exploring different possible routes, including a segment that approaches from the west and uses part or all of maximal metal shape 810. The router may insert vias to connect metal shape 810 to metal shapes on other metal layers. Whenever the router vias-up (or vias-down) from a location on the maximal shape, the actual metal shape is sufficient long if it covers the via-pad. In FIG. 8A, the router would like to insert a via 830. However, as shown in FIG. 8B, the shortest metal shape 812 that connects to via 830 would have a line end in the keep-through region 820, which is a violation.

To comply with the keep-through region 820, the router may extend the metal shape 814 past the via 830 to the edge of the keep-through region 820, as shown in FIG. 8C. The extension region 816 creates extra length for the metal shape. For accurate parasitic/cost estimates in routing, the line end extension 816 should be costed appropriately. With the presence of keep-through region 820, it is easier to cost such extensions during routing. The extension is just the extra length of extension 816.

Figure 8D:
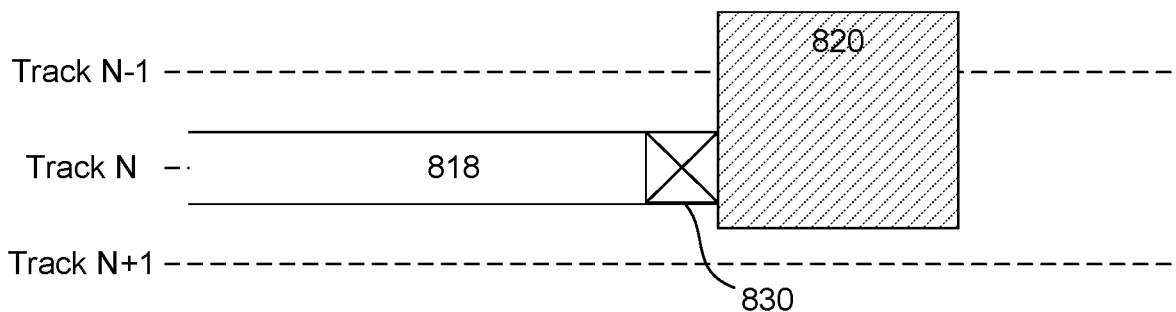

FIG. 8D shows an alternate solution in which the metal shape 818 is truncated. This also complies with the keep-through region 820. However, it requires repositioning of the via 830.

Routing with keep-through regions was described above using certain examples, but the technology is not limited to these examples. For example, keep-through regions may also be used for non-monotonous spacing rules which are found in recent technologies. In older design rules, metal shapes that had overlapping run lengths had to be spaced farther away. The spacing was a monotonic function of the run length. This is no longer the case. Keep-through regions may be used in these scenarios. As another example, keep-through regions may also be used for layouts that are not based on tracks. As a final example, keep-through regions may also be used for interconnects that are not metal.

Figure 9:
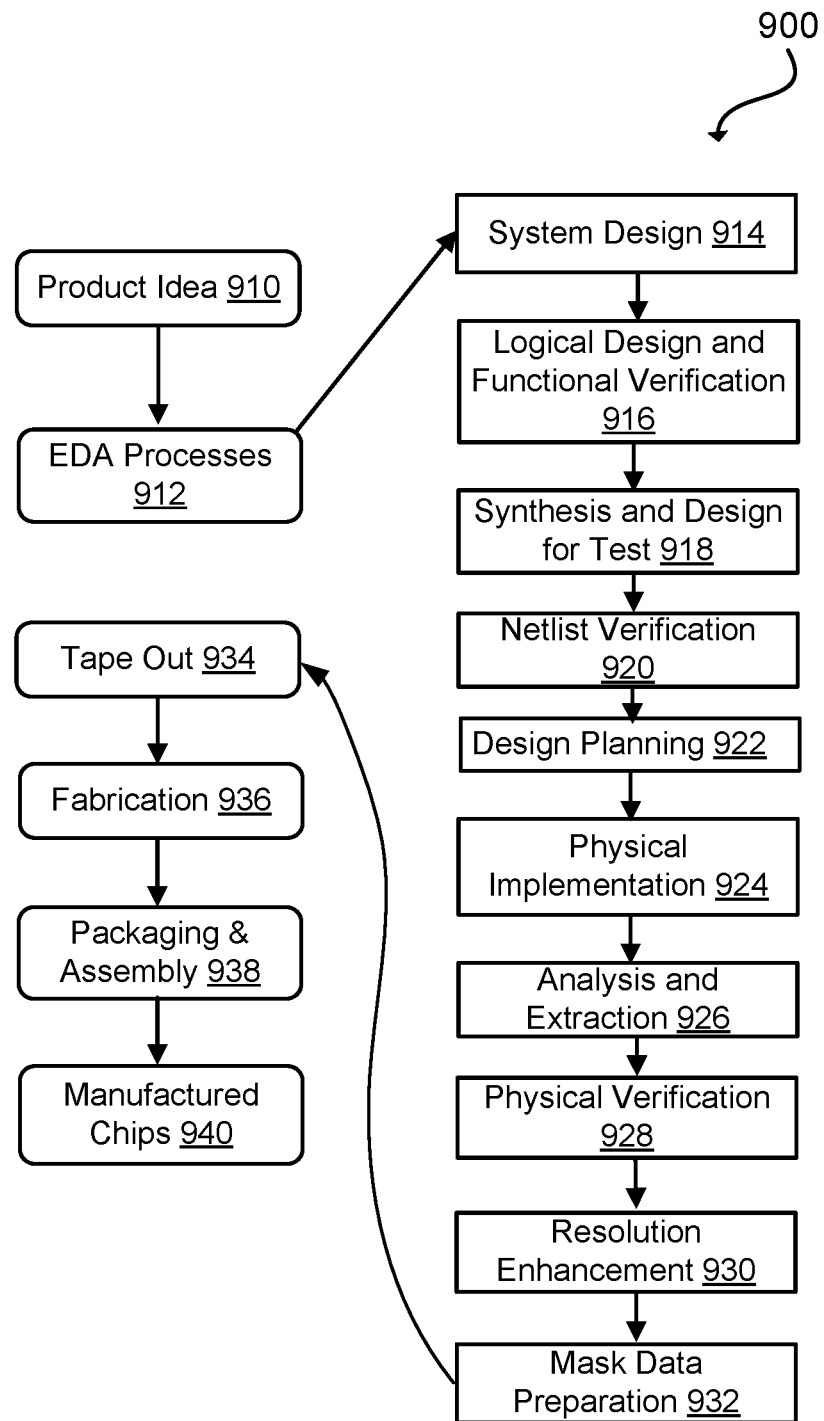
FIG. 9 depicts a flowchart of various processes used during the design and manufacture of an integrated circuit in accordance with some embodiments of the present disclosure.

FIG. 9 illustrates an example set of processes 900 used during the design, verification, and fabrication of an article of manufacture such as an integrated circuit to transform and verify design data and instructions that represent the integrated circuit. Each of these processes can be structured and enabled as multiple modules or operations. The term 'EDA' signifies the term 'Electronic Design Automation.' These processes start with the creation of a product idea 910 with information supplied by a designer, information which is transformed to create an article of manufacture that uses a set of EDA processes 912. When the design is finalized, the design is taped-out 934, which is when artwork (e.g., geometric patterns) for the integrated circuit is sent to a fabrication facility to manufacture the mask set, which is then used to manufacture the integrated circuit. After tape-out, a semiconductor die is fabricated 936 and packaging and assembly processes 938 are performed to produce the finished integrated circuit 940.

Specifications for a circuit or electronic structure may range from low-level transistor material layouts to high-level description languages. A high-level of abstraction may be used to design circuits and systems, using a hardware description language ('HDL') such as VHDL, Verilog, SystemVerilog, SystemC, MyHDL or OpenVera. The HDL description can be transformed to a logic-level register transfer level ('RTL') description, a gate-level description, a layout-level description, or a mask-level description. Each lower abstraction level that is a less abstract description adds more useful detail into the design description, for example, more details for the modules that include the description. The lower levels of abstraction that are less abstract descriptions can be generated by a computer, derived from a design library, or created by another design automation process. An example of a specification language at a lower level of abstraction language for specifying more detailed descriptions is SPICE, which is used for detailed descriptions of circuits with many analog components. Descriptions at each level of abstraction are enabled for use by the corresponding tools of that layer (e.g., a formal verification tool). A design process may use a sequence depicted in FIG. 9. The processes described by be enabled by EDA products (or tools).

During system design 914, functionality of an integrated circuit to be manufactured is specified. The design may be optimized for desired characteristics such as power consumption, performance, area (physical and/or lines of code), and reduction of costs, etc. Partitioning of the design into different types of modules or components can occur at this stage.

During logic design and functional verification 916, modules or components in the circuit are specified in one or more description languages and the specification is checked for functional accuracy. For example, the components of the circuit may be verified to generate outputs that match the requirements of the specification of the circuit or system being designed. Functional verification may use simulators and other programs such as testbench generators, static HDL checkers, and formal verifiers. In some embodiments, special systems of components referred to as 'emulators' or 'prototyping systems' are used to speed up the functional verification.

During synthesis and design for test 918, HDL code is transformed to a netlist. In some embodiments, a netlist may be a graph structure where edges of the graph structure represent components of a circuit and where the nodes of the graph structure represent how the components are interconnected. Both the HDL code and the netlist are hierarchical articles of manufacture that can be used by an EDA product to verify that the integrated circuit, when manufactured, performs according to the specified design. The netlist can be optimized for a target semiconductor manufacturing technology. Additionally, the finished integrated circuit may be tested to verify that the integrated circuit satisfies the requirements of the specification.

During netlist verification 920, the netlist is checked for compliance with timing constraints and for correspondence with the HDL code. During design planning 922, an overall floor plan for the integrated circuit is constructed and analyzed for timing and top-level routing.

During layout or physical implementation 924, physical placement (positioning of circuit components such as transistors or capacitors) and routing (connection of the circuit components by multiple conductors) occurs, and the selection of cells from a library to enable specific logic functions can be performed. As used herein, the term 'cell' may specify a set of transistors, other components, and interconnections that provides a Boolean logic function (e.g., AND, OR, NOT, XOR) or a storage function (such as a flipflop or latch). As used herein, a circuit 'block' may refer to two or more cells. Both a cell and a circuit block can be referred to as a module or component and are enabled as both physical structures and in simulations. Parameters are specified for selected cells (based on 'standard cells') such as size and made accessible in a database for use by EDA products.

During analysis and extraction 926, the circuit function is verified at the layout level, which permits refinement of the layout design. During physical verification 928, the layout design is checked to ensure that manufacturing constraints are correct, such as DRC constraints, electrical constraints, lithographic constraints, and that circuitry function matches the HDL design specification. During resolution enhancement 930, the geometry of the layout is transformed to improve how the circuit design is manufactured.

During tape-out, data is created to be used (after lithographic enhancements are applied if appropriate) for production of lithography masks. During mask data preparation 932, the 'tape-out' data is used to produce lithography masks that are used to produce finished integrated circuits.

A storage subsystem of a computer system (such as computer system 1000 of FIG. 10) may be used to store the programs and data structures that are used by some or all of the EDA products described herein, and products used for development of cells for the library and for physical and logical design that use the library.

Figure 10:
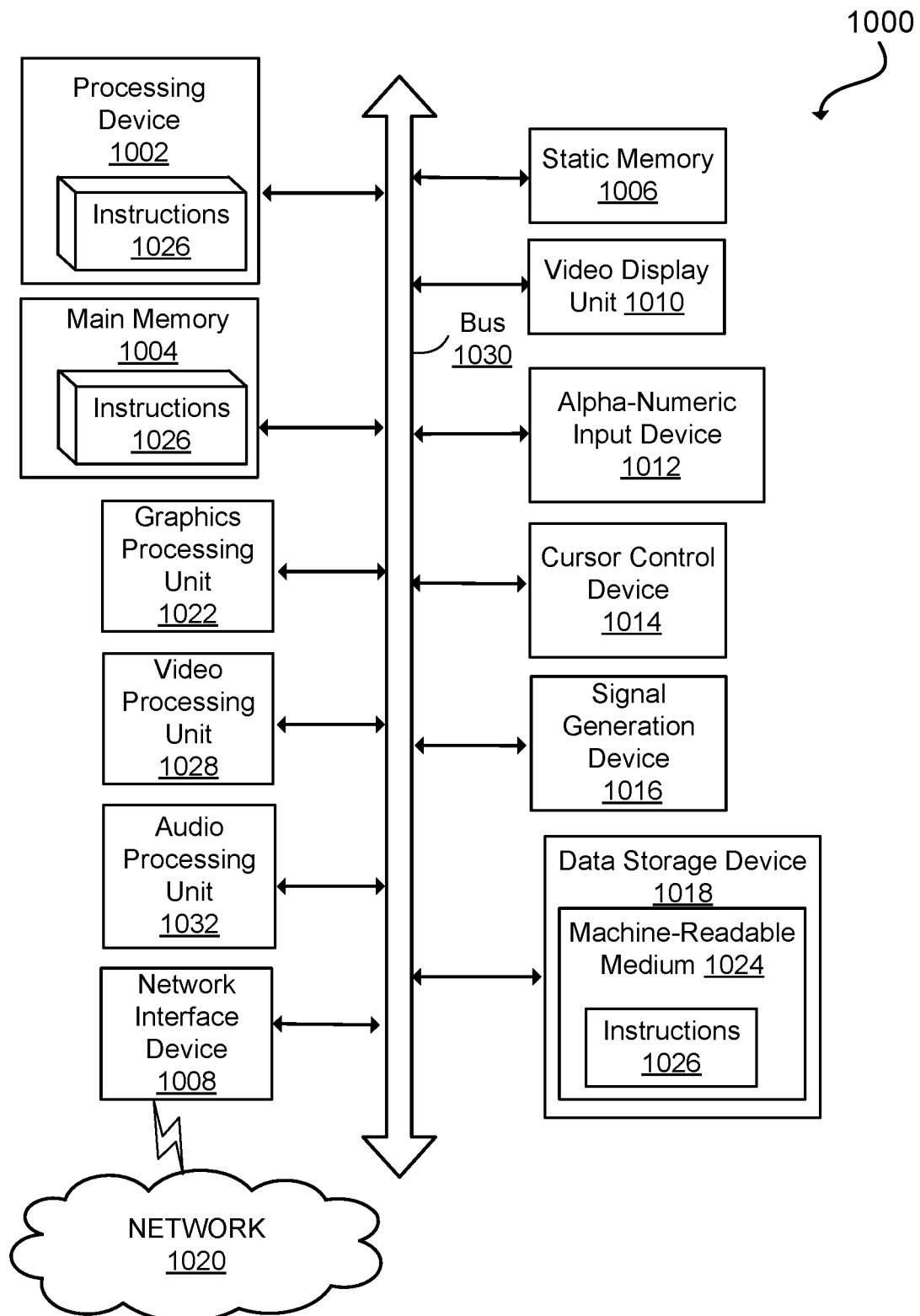
FIG. 10 depicts an abstract diagram of an example computer system in which embodiments of the present disclosure may operate.

FIG. 10 illustrates an example machine of a computer system 1000 within which a set of instructions, for causing the machine to perform any one or more of the methodologies discussed herein, may be executed. In alternative implementations, the machine may be connected (e.g., networked) to other machines in a LAN, an intranet, an extranet, and/or the Internet. The machine may operate in the capacity of a server or a client machine in client-server network environment, as a peer machine in a peer-to-peer (or distributed) network environment, or as a server or a client machine in a cloud computing infrastructure or environment.

The machine may be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 1000 includes a processing device 1002, a main memory 1004 (e.g., read-only memory (ROM), flash memory, dynamic random access memory (DRAM) such as synchronous DRAM (SDRAM), a static memory 1006 (e.g., flash memory, static random access memory (SRAM), etc.), and a data storage device 1018, which communicate with each other via a bus 1030.

Processing device 1002 represents one or more processors such as a microprocessor, a central processing unit, or the like. More particularly, the processing device may be complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 1002 may also be one or more special-purpose processing devices such as an application specific integrated circuit (ASIC), a field programmable gate array (FPGA), a digital signal processor (DSP), network processor, or the like. The processing device 1002 may be configured to execute instructions 1026 for performing the operations and steps described herein.

The computer system 1000 may further include a network interface device 1008 to communicate over the network 1020. The computer system 1000 also may include a video display unit 1010 (e.g., a liquid crystal display (LCD) or a cathode ray tube (CRT)), an alphanumeric input device 1012 (e.g., a keyboard), a cursor control device 1014 (e.g., a mouse), a graphics processing unit 1022, a signal generation device 1016 (e.g., a speaker), graphics processing unit 1022, video processing unit 1028, and audio processing unit 1032.

The data storage device 1018 may include a machine-readable storage medium 1024 (also known as a non-transitory computer-readable medium) on which is stored one or more sets of instructions 1026 or software embodying any one or more of the methodologies or functions described herein. The instructions 1026 may also reside, completely or at least partially, within the main memory 1004 and/or within the processing device 1002 during execution thereof by the computer system 1000, the main memory 1004 and the processing device 1002 also constituting machine-readable storage media.

In some implementations, the instructions 1026 include instructions to implement functionality corresponding to the present disclosure. While the machine-readable storage medium 1024 is shown in an example implementation to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine and the processing device 1002 to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm may be a sequence of operations leading to a desired result. The operations are those requiring physical manipulations of physical quantities. Such quantities may take the form of electrical or magnetic signals capable of being stored, combined, compared, and otherwise manipulated. Such signals may be referred to as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the present disclosure, it is appreciated that throughout the description, certain terms refer to the action and processes of a computer system, or similar electronic computing device, that manipulates and transforms data represented as physical (electronic) quantities within the computer system's registers and memories into other data similarly represented as physical quantities within the computer system memories or registers or other such information storage devices.

The present disclosure also relates to an apparatus for performing the operations herein. This apparatus may be specially constructed for the intended purposes, or it may include a computer selectively activated or reconfigured by a computer program stored in the computer. Such a computer program may be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various other systems may be used with programs in accordance with the teachings herein, or it may prove convenient to construct a more specialized apparatus to perform the method. In addition, the present disclosure is not described with reference to any particular programming language. It will be appreciated that a variety of programming languages may be used to implement the teachings of the disclosure as described herein.

The present disclosure may be provided as a computer program product, or software, that may include a machine-readable medium having stored thereon instructions, which may be used to program a computer system (or other electronic devices) to perform a process according to the present disclosure. A machine-readable medium includes any mechanism for storing information in a form readable by a machine (e.g., a computer). For example, a machine-readable (e.g., computer-readable) medium includes a machine (e.g., a computer) readable storage medium such as a read only memory ("ROM"), random access memory ("RAM"), magnetic disk storage media, optical storage media, flash memory devices, etc.

In the foregoing disclosure, implementations of the disclosure have been described with reference to specific example implementations thereof. It will be evident that various modifications may be made thereto without departing from the broader spirit and scope of implementations of the disclosure as set forth in the following claims. Where the disclosure refers to some elements in the singular tense, more than one element can be depicted in the figures and like elements are labeled with like numerals. The disclosure and drawings are, accordingly, to be regarded in an illustrative sense rather than a restrictive sense.

The invention claimed is:

1. A method comprising:
   accessing a layout design of an integrated circuit, wherein the layout design has already been placed; and
   applying, by a processor device, a routing process to the layout design, the routing process comprising:
      generating keep-through regions for the layout design based on end-of-line rules applicable to routing of interconnects for the layout design, wherein the keep-through regions specify areas in the layout design where metal shapes laid out as part of the routing process are allowed to overlap with the keep-through region, but line ends of the metal shapes are not allowed to be located within the keep-through region; and
      determining a layout of interconnects for the layout design, the layout of interconnects comprising metal shapes having line ends in accordance with the keep-through regions; wherein determining the layout of interconnects comprises locating a line end of at least one of the metal shapes within one of the keep-through regions, and then extending the metal shape so that the line end is no longer located within the keep-through regions; wherein determining the layout of interconnects is performed progressively for a plurality of interconnects, and generating the keep-through regions comprises generating the keep-through regions for completed interconnects.

2. The method of claim 1 wherein at least some of the keep-through regions are generated based on rules for line end spacing for cut-metal shapes.

3. The method of claim 1 wherein at least some of the keep-through regions are generated based on rules for line end spacing for soft requirements of cut-metal shapes.

4. The method of claim 1 wherein generating the keep-through regions further comprises generating the keep-through regions for trial metal shapes of interconnects currently being routed.

5. The method of claim 1 wherein the interconnects are laid out in tracks; and determining the layout of interconnects comprises determining maximum available metal spaces on the tracks in accordance with the keep-through regions, and then determining the layout of interconnects within the maximum available metal spaces.

6. The method of claim 5 wherein the maximum available metal spaces are determined by first applying keep-out regions and then applying keep-through regions, wherein the keep-out regions specify areas in the layout design which the metal shapes are not allowed to overlap with the keep-out region.

7. The method of claim 6 further comprising converting keep-through regions located at ends of maximum available metal spaces to keep-out regions.

8. The method of claim 1 wherein determining the layout of interconnects further comprises
costing the extensions of metal shapes in determining the layout.

9. A system comprising:
a memory storing instructions; and
a processor device, coupled with the memory and to execute the instructions, the instructions when executed cause the processor device to apply a routing process to a layout design of an integrated circuit that has already been placed, the routing process comprising:
generating keep-through regions for the layout design based on end-of-line rules applicable to routing of interconnects for the layout design, wherein the interconnects comprise shapes, the keep-through regions specify areas in the layout design where the shapes are allowed to overlap with the keep-through region, but the line ends of the shapes are not allowed to be located within the keep-through region; and
determining a layout of the interconnects for the layout design, the layout of interconnects comprising shapes having line ends in accordance with the keep-through wherein determining the layout of interconnects comprises locating a line end of at least one of the shapes within one of the keep-through regions, and then extending the shape so that the line end is no longer located within the keep-through region; and wherein determining the layout of interconnects is performed progressively for a plurality of interconnects, and generating the keep-through regions comprises generating the keep-through regions for completed interconnects.

10. The system of claim 9 wherein determining the layout of interconnects comprises locating a line end of at least one of the shapes within a keep-through region and then truncating or extending the metal shape so that the line end is no longer located within the keep-through region.

11. The system of claim 9 wherein the interconnects are laid out in tracks; and at least some keep-through regions generated for the shapes on one track also apply to shapes on adjacent tracks.

12. The system of claim 9 wherein at least some keep-through regions are directional, wherein shapes entering the keep-through region from one side are not allowed to have line ends in the keep-through region but shapes entering the keep-through region from an opposite side are allowed to have line ends in the keep-through region.

13. The system of claim 9 wherein determining the layout of interconnects comprises merging keep-through regions, and then determining the layout of interconnects in accordance with the merged keep-through regions.

14. The system of claim 9 wherein the layout design for the integrated circuit is based on a 20 nm or more advanced process technology node.

15. A non-transitory computer readable medium comprising stored instructions, which when executed by a processor device, cause the processor device to apply a routing process to progressively determine interconnects for a layout design of an integrated circuit that has already been placed, the routing process comprising, for a current set of routes under consideration:
generating keep-through regions for the layout design based on end-of-line rules applicable to previously completed routes, wherein the keep-through regions specify areas in the layout design where metal shapes laid out as part of the routing process are allowed to overlap with the keep-through region, but line ends of the metal shapes are not allowed to be located within the keep-through region; and
determining a layout of the current set of routes, the determined layout of the current set of routes comprising metal shapes having line ends in accordance with the keep-through wherein determining the layout of the current set of routes comprises locating a line end of at least one of the metal shapes within one of the keep-through regions, and then extending the metal shape so that the line end is no longer located within the keep-through region; and the routing process is performed progressively for a plurality of routes, and generating the keep-through regions comprises generating the keep-through regions for previously completed routes.

16. The non-transitory computer readable medium of claim 15 wherein the routing process further comprises:
identifying line ends of metal shapes from previously completed routes, based on a width and length of convex local features of the metal shapes.

17. The non-transitory computer readable medium of claim 15 wherein determining the layout of interconnects further comprises:
costing the extensions of metal shapes in determining the layout.

* * * * *